(12) United States Patent
Kavousian et al.

(10) Patent No.: US 9,595,935 B2
(45) Date of Patent: Mar. 14, 2017

(54) ACTIVE NOTCH FILTER

(71) Applicant: QUALCOMM Incorporated, San Diego, CA (US)

(72) Inventors: Amirpouya Kavousian, San Jose, CA (US); Yashar Rajavi, Mountain View, CA (US); Alireza Khalili, Sunnyvale, CA (US); Mohammad Bagher Vahid Far, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 7 days.

(21) Appl. No.: 14/709,897

(22) Filed: May 12, 2015

(65) Prior Publication Data
US 2016/0336915 A1 Nov. 17, 2016

(51) Int. Cl.
| H04B 3/04 | (2006.01) |
| H03H 7/01 | (2006.01) |
| H03F 1/34 | (2006.01) |
| H03F 1/56 | (2006.01) |
| H03F 3/24 | (2006.01) |
| H03H 7/09 | (2006.01) |
| H04B 1/18 | (2006.01) |
| H03H 7/06 | (2006.01) |

(52) U.S. Cl.
CPC ........... *H03H 7/0123* (2013.01); *H03F 1/347* (2013.01); *H03F 1/565* (2013.01); *H03F 3/245* (2013.01); *H03H 7/06* (2013.01); *H03H 7/09* (2013.01); *H03H 7/1741* (2013.01); *H04B 1/18* (2013.01); *H03H 2007/013* (2013.01)

(58) Field of Classification Search
CPC .......... H03H 7/0123; H03H 7/06; H03H 7/09; H03H 7/1741; H03H 2007/013; H03F 1/347; H03F 1/565; H03F 3/245; H04B 1/18

USPC ........................................................ 333/17.1
See application file for complete search history.

(56) References Cited

U.S. PATENT DOCUMENTS

| 4,662,001 | A | 4/1987 | Cruz et al. |
| 5,451,915 | A | 9/1995 | Katzin et al. |
| 6,681,103 | B1 | 1/2004 | Rogers et al. |
| 6,778,023 | B2 | 8/2004 | Christensen |
| 7,522,024 | B2 | 4/2009 | Beffa |
| 7,825,746 | B2 | 11/2010 | Yeung et al. |
| 8,929,945 | B1 | 1/2015 | Wei et al. |
| 8,981,866 | B2 | 3/2015 | Frye et al. |
| 2004/0251958 | A1 | 12/2004 | Paakonen |

(Continued)

FOREIGN PATENT DOCUMENTS

GB 2502090 A 11/2013

OTHER PUBLICATIONS

International Search Report and Written Opinion—PCT/US2016/026943—ISA/EPO—Jul. 7, 2016.

*Primary Examiner* — Robert Pascal
*Assistant Examiner* — Kimberly Glenn
(74) *Attorney, Agent, or Firm* — Paradice and Li LLP

(57) ABSTRACT

A method and apparatus are disclosed for filtering a signal, such as a transmit communication signal with a configurable notch filter. The configurable notch filter may attenuate a set of frequencies near a selected notch frequency. In some embodiments, the configurable notch filter may include a variable resistor, a variable capacitor, a first inductor, and a second inductor. The variable resistor may be configured to compensate for resistive losses within the configurable notch filter. The variable capacitor may be configured to determine the set of frequencies to be attenuated.

20 Claims, 6 Drawing Sheets

(56) References Cited

U.S. PATENT DOCUMENTS

| | | |
|---|---|---|
| 2013/0187712 A1 | 7/2013 | Cabanillas et al. |
| 2014/0176388 A1 | 6/2014 | Van Liempd et al. |
| 2014/0320230 A1 | 10/2014 | Jooyaie et al. |

ACTIVE NOTCH FILTER

TECHNICAL FIELD

The present embodiments relate generally to communication devices, and specifically to active notch filters used within communication devices.

BACKGROUND OF RELATED ART

Communication devices may transmit and receive communication data through a communication medium. In one example, the communication medium may be a wireless communication medium where communication data is transmitted and received by communication devices according to a wireless communication protocol. Example wireless communication protocols may include IEEE 802.11 protocols and BLUETOOTH® protocols in accordance with the Bluetooth Special Interest Group. In another example, the communication medium may be a wired communication medium where the communication data is transmitted and received according to a wire-based communication protocol. Some example wire-based protocols may include an Ethernet® protocol and/or a Powerline Communications protocol described by the HomePlug 2.0 specification. In yet another example, the communication medium may be a hybrid combination of wired and wireless communication mediums.

Analog signals within communication devices may undergo amplification during various processing operations. For example, an analog signal may be amplified during the process of receiving and/or transmitting a communication signal to and/or from another communication device. In some cases, as an analog signal is amplified, an unwanted frequency may also be amplified. For example, as a signal is amplified, an unwanted harmonic of the signal (e.g., a frequency spur) may also be amplified. The frequency spur may couple into a sensitive receive and/or transmit circuit and interfere with the transmission and/or reception of the communication signal.

Thus, there is a need to improve the processing of analog signals by suppressing unwanted frequencies, and thereby improve the performance of the communication device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A configurable notch filter and method of operation are disclosed. In some embodiments, the configurable notch filter may attenuate a set of frequencies within a transmit communication signal. The configurable notch filter may include a first inductive element to receive the transmit communication signal, and a second inductive element magnetically coupled to the first inductive element. The configurable notch filter may also include a variable capacitor electrically coupled in parallel to the second inductive element. The variable capacitor may have a capacitance value that is directly proportional to an inductance value of the first inductive element and is inversely proportional to an inductance value of the second inductive element.

In some embodiments, the first inductive element and the second inductive element may form a mutual inductor with a mutual inductance value. When the first inductive element and the second inductive element are mutual inductors, the capacitance value of the variable capacitor may be inversely proportional to the mutual inductance value. In some embodiments, the first inductive element may encircle the second inductive element.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

The present embodiments are described below in the context of Wi-Fi enabled devices for simplicity only. It is to be understood that the present embodiments are equally applicable to other wireless networks (e.g., cellular networks, pico networks, femto networks, satellite networks), as well as for systems using signals of one or more wired standards or protocols (e.g., Ethernet and/or HomePlug/PLC standards). As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig). Thus, the terms "WLAN" and "Wi-Fi" may be used interchangeably herein. In addition, the example embodiments described herein may be implemented within infrastructure WLAN systems including one or more APs and a number of STAs, within multiple WLANs, within peer-to-peer (or Independent Basic Service Set) systems, within Wi-Fi Direct systems, and/or within Hotspots. In addition, although described herein in terms of exchanging data frames between wireless devices, the example embodiments may be applied to the exchange of any data unit, packet, and/or frame between wireless devices.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1:
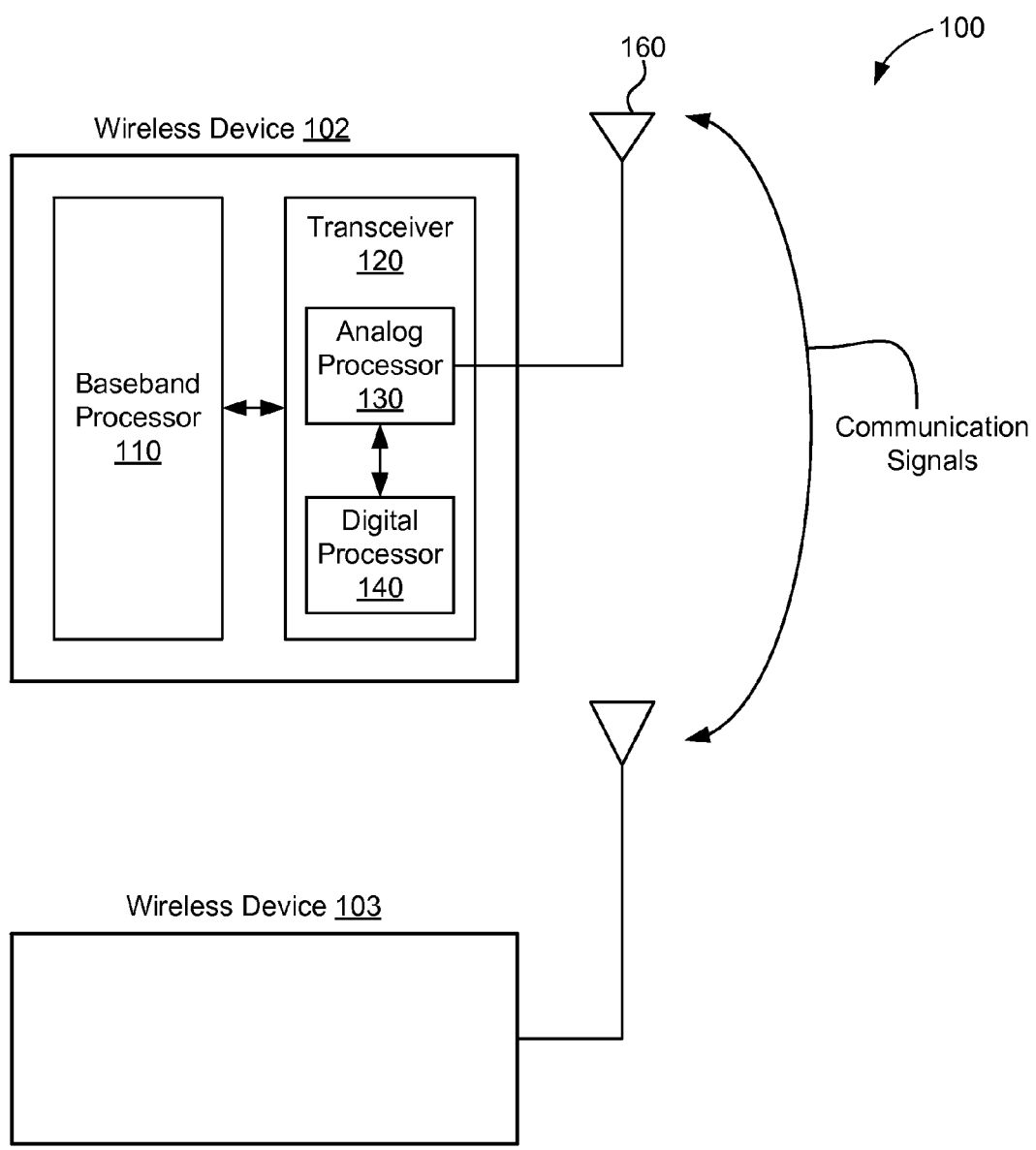
FIG. 1 depicts an example communication system within which example embodiments may be implemented.

FIG. 1 depicts an example communication system 100 within which example embodiments may be implemented. Communication system 100 may be a wireless system and may include wireless device 102 and wireless device 103. Although only two wireless devices 102-103 are shown, for simplicity, communication system 100 may include any number of wireless devices. Each of wireless devices 102-103 may be any suitable Wi-Fi enabled wireless device including, for example, a cell phone, personal digital assistant (PDA), tablet device, laptop computer, or the like. Each of the wireless devices 102-103 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a mobile station (STA), a client, or some other suitable terminology. For some embodiments, each of wireless devices 102-103 may include one or more processing resources (e.g., processors and/or ASICs), one or more memory resources, and a power source (e.g., a battery). The memory resources may include a non-transitory computer-readable medium (e.g., one or more nonvolatile memory elements, such as EPROM, EEPROM, Flash memory, a hard drive, etc.) that stores instructions for performing operations described below with respect to FIG. 8.

In some embodiments, communication system 100 may be a wired system and may include wired devices coupled to a wire or cable (not shown for simplicity). In still other embodiments, communication system 100 may be a hybrid system and may include both wireless and wired devices.

Wireless device 102 may include a transceiver 120, a baseband processor 110, and an antenna 160. Although not shown for simplicity, wireless device 102 may include a plurality of antennas. Baseband processor 110 may provide data to be transmitted to and/or receive data from one or more other wireless devices (e.g., wireless device 103) via transceiver 120 and antenna 160. For example, baseband processor 110 may encode and/or decode the communication data for transmission and/or reception by transceiver 120.

Transceiver 120 may include a digital processor 140 and an analog processor 130. Digital processor 140 may receive the communication data from and provide the communication data to baseband processor 110. In some embodiments, the communication data may be processed by transceiver 120 according to a wireless communication protocol such as Wi-Fi, BLUETOOTH, cellular, near-field communication, WiGig, Zig-Bee, and/or any other feasible wireless communication protocol. For example, with respect to a Wi-Fi communication protocol, transceiver 120 may communicate within a 2.4 GHz frequency band and/or within a 5 GHz frequency band in accordance with the IEEE 802.11 specification. In another example, with respect to a cellular communication protocol, transceiver 120 may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol).

In other embodiments, transceiver 120 may process communication data according to a wire-based protocol such as an Ethernet, Powerline Communication (PLC), or any other feasible wire-based communication protocol. For example, transceiver 120 may communicate through power lines in accordance with a Powerline Communication protocol described by a HomePlug 2.0 specification. In still other embodiments, transceiver 120 may process communication data according to both a wireless and a wire-based communication protocol.

In at least one embodiment, analog processor 130 may be coupled to digital processor 140 and to antenna 160. Analog processor 130 may process communication data to and/or from digital processor 140. For example, analog processor 130 may process communication data from digital processor 140 for transmission through antenna 160. Additionally, analog processor 130 may process communication data received through antenna 160.

One or more analog signals may be amplified and/or otherwise processed within wireless device 102 or wireless device 103. In some embodiments, when an analog signal is processed, unwanted frequencies (e.g., frequency spurs and/or harmonics) may be amplified in the analog signal. The unwanted frequencies may undesirably affect the analog signal by reducing an associated signal-to-noise ratio and/or causing a distortion of the processed analog signal. To attenuate the unwanted frequencies, the analog signal may be filtered by a configurable notch filter (not shown for simplicity) provided within wireless device 102 and/or wireless device 103. In some embodiments, the configurable notch filter may be included within analog processor 130. Operation and details associated with an example embodiment of a configurable notch filter are described in more detail below in conjunction with FIGS. 2 and 3.

Figure 2:
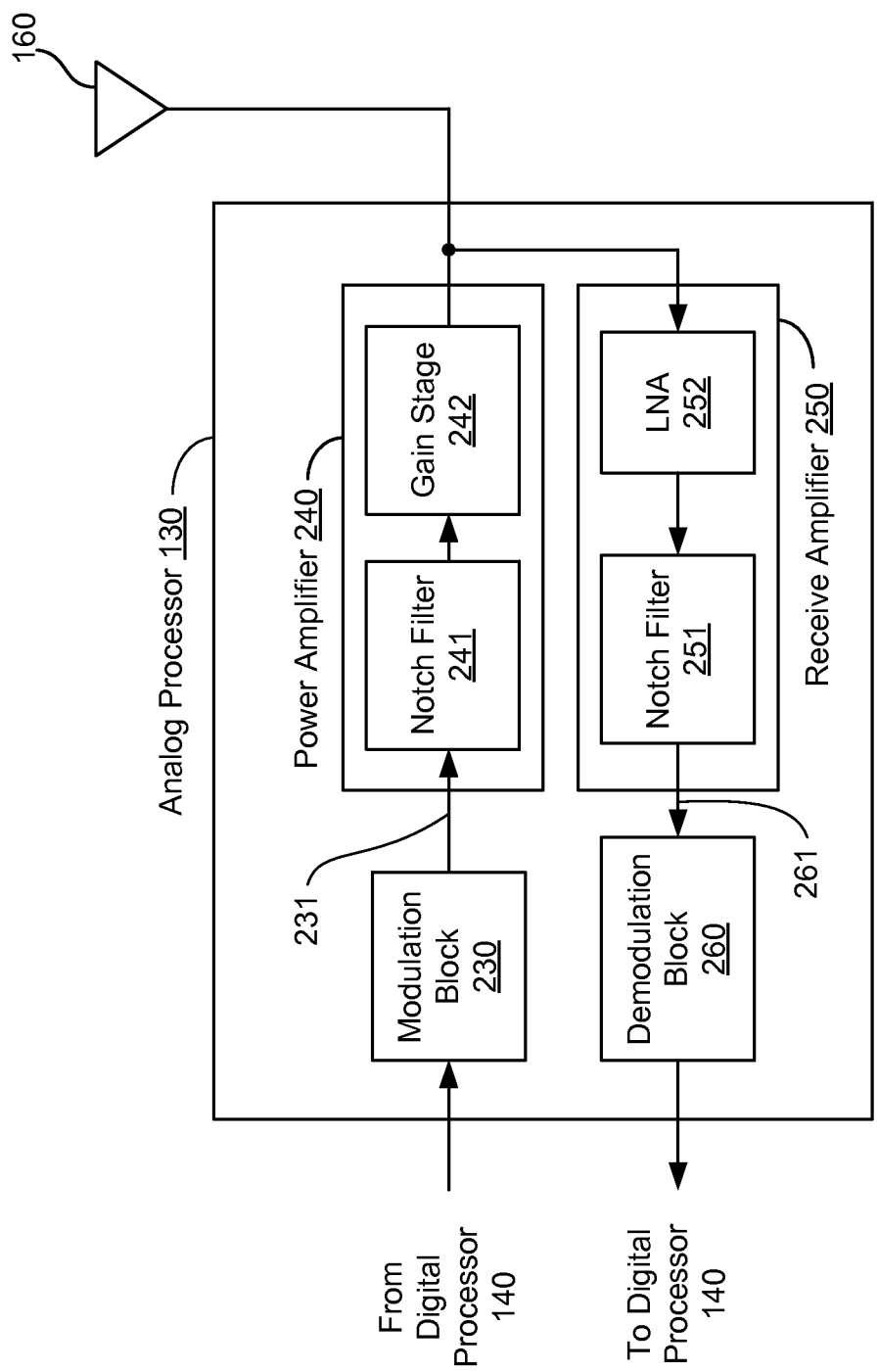
FIG. 2 shows a block diagram of an analog processor of FIG. 1, in accordance with example embodiments.

FIG. 2 shows a block diagram of analog processor 130 of FIG. 1, in accordance with example embodiments. Analog processor 130 may include a modulation block 230, a power amplifier 240, a demodulation block 260, and a receive amplifier 250. Modulation block 230 may receive communication data from digital processor 140 (not shown for simplicity). In some embodiments, modulation block 230 may modulate communication data by mixing (multiplying) the communication data with a local oscillator (LO) signal to generate a transmit communication signal 231.

Transmit communication signal 231 may be received by power amplifier 240. Power amplifier 240 may receive and amplify transmit communication signal 231 for transmission through antenna 160. Power amplifier 240 may include a first configurable notch filter 241 and a gain stage 242. In some embodiments, transmit communication signal 231 may be filtered by first configurable notch filter 241 to remove or attenuate unwanted frequencies prior to amplification by gain stage 242. Removing and/or attenuating unwanted frequencies before amplification may increase a power efficiency of analog processor 130 by amplifying desired frequencies and not amplifying unwanted frequencies.

A communication signal may be received through antenna 160 and may be provided to receive amplifier 250. Receive amplifier 250 may include a low noise amplifier (LNA) 252 and a second configurable notch filter 251. In some embodiments, second configurable notch filter 251 may be another embodiment of first configurable notch filter 241. LNA 252 may amplify the communication signal received through antenna 160. Second configurable notch filter 251 may filter (similar to as described above with respect to first configurable notch filter 241) the amplified communication signal and provide a receive communication signal 261 to demodulation block 260. Demodulation block 260 may mix the LO signal with the receive communication signal 261 to recover and provide communication data to digital processor 140.

First configurable notch filter 241 and/or second configurable notch filter 251 may be configured to remove or attenuate frequencies based, at least in part, on signal content. For example, if transmit communication signal 231 is generated by an LO signal having a frequency f, transmit communication signal 231 may include an unwanted frequency spur associated with a harmonic, such as a third harmonic, of the LO frequency. Thus, first configurable notch filter 241 may be configured to remove or attenuate frequencies near 3f. The frequencies near 3f may be referred to as notch frequencies. In other embodiments, other multiples of frequency f may be considered unwanted frequencies and may be attenuated by first configurable notch filter 241. Although described in conjunction with harmonic frequencies, those having ordinary skill in the art will appreciate that first configurable notch filter 241 may be configured to remove or attenuate any frequencies. In a similar manner, second configurable notch filter 251 may remove or attenuate frequencies associated with a received communication signal.

Figure 3:
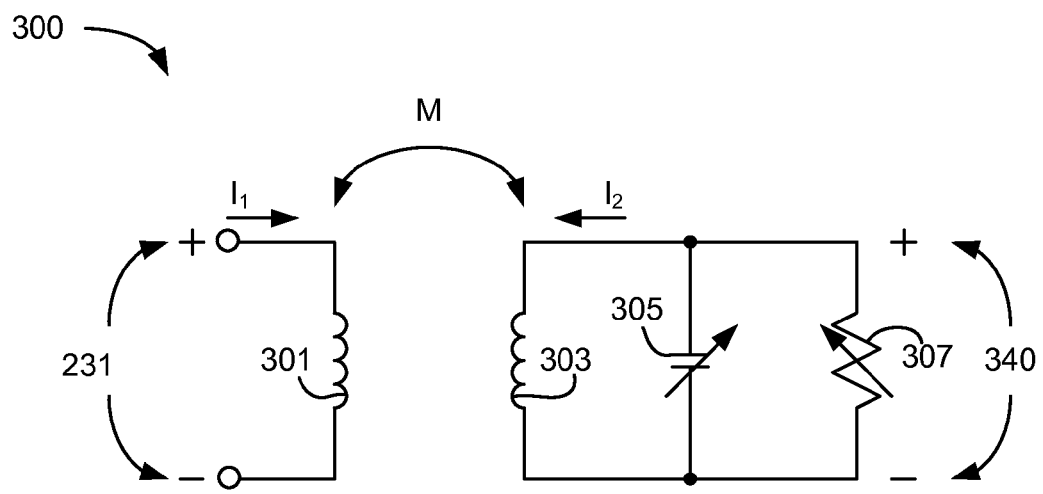
FIG. 3 shows a simplified schematic diagram of a configurable notch filter, in accordance with example embodiments.

FIG. 3 shows a simplified schematic diagram of a configurable notch filter 300, in accordance with example embodiments. Configurable notch filter 300 may include a main inductor 301, a secondary inductor 303, a variable capacitor 305, and a variable resistor 307. Configurable notch filter 300 may receive an input signal, such as transmit communication signal 231, through main inductor 301. Although described in conjunction with transmit communication signal 231, configurable notch filter 300 may be used to filter any technically feasible analog signal. Secondary inductor 303 may be magnetically coupled to main inductor 301. In some embodiments, main inductor 301 and secondary inductor 303 may be mutual inductors having a mutual inductance value of M henrys. In other embodiments, main inductor 301 and/or secondary inductor 303 may be any technically feasible inductive element.

Variable capacitor 305 may be coupled in parallel with secondary inductor 303. In some embodiments, variable capacitor 305 may be a varactor, a switched array of capacitors, a microelectromechanical system (MEMS) capacitor, or any other technically feasible variable charge storage device. In still other embodiments, variable capacitor 305 may share one or more physical characteristics with other variable capacitors included within wireless device 102 or wireless device 103. For example variable capacitor 305 may be similar (e.g., have a similar physical structure) to other variable capacitors that may be included within a local oscillator used within analog processor 130. Thus, if a capacitor associated with the local oscillator is characterized (e.g., capacitance determined with respect to operating voltage, temperature, and/or frequency), then, by extension, variable capacitor 305 may also be characterized.

Variable resistor 307 may be coupled in parallel to variable capacitor 305. In some embodiments, variable resistor 307 may provide a negative resistance. The negative resistance may be selected to compensate for resistive losses within configurable notch filter 300. For example, variable resistor 307 may compensate for resistive losses associated with main inductor 301 and/or secondary inductor 303. In some embodiments, the negative resistance may be provided by cross coupled transistors (not shown for simplicity).

A filter output signal 340 may be generated across variable resistor 307, variable capacitor 305, and/or secondary inductor 303. A frequency response of configurable notch filter 300 may be based, at least in part, on capacitance values of variable capacitor 305, inductance values of main inductor 301, and/or inductance values of secondary inductor 303. Thus, capacitance values and/or inductance values may be selected to modify the frequency response of configurable notch filter 300 to attenuate frequencies.

Since variable resistor 307 may be configured to have a resistance value to compensate for resistive losses, equations to describe an operation of configurable notch filter 300 may be simplified. Resistive losses may be determined empirically through measurement or may be determined through simulation of configurable notch filter 300. Thus, a voltage (V1) across main inductor 301 may be expressed by equation 1 shown below:

$$V1(\omega) = jL1\omega I_1 + jM\omega I_2 \qquad (eq.\ 1)$$

where L1 is the inductance value of main inductor 301;
$I_i$ is the current through main inductor 301;
M is the mutual inductance value between main inductor 301 and secondary inductor 303;
$I_2$ is the current through secondary inductor 303; and
ω is the frequency of an input signal.

A voltage (V2) across secondary inductor 303 (and identical to filter output signal 340) may be expressed by equation 2 shown below:

$$V2(\omega) = jM\omega I_2 + jL\omega I_2 \qquad (eq.\ 2)$$

where L2 is the inductance value of secondary inductor 303.

V2 may also be described by a voltage across variable capacitor 305 and may be expressed by equation 3 shown below:

$$V2(\omega) = -\frac{1}{j\omega C} I_2 \qquad (eq.\ 3)$$

where C=capacitance value of variable capacitor 305.

Setting V1(ω)=0, and simplifying equations 1-3, the value for C may be expressed by equation 4 shown below:

$$C = \frac{1}{L1 * (1 - K^2)} * \frac{1}{\omega^2} \qquad (eq.\ 4)$$

where $$K = \frac{M}{\sqrt{L1 L2}}. \qquad (eq.\ 5)$$

Thus, to introduce a "notch" (e.g., a reduced output voltage and/or output current) into the frequency response of configurable notch filter 300 near frequency ω, a capacitance value C for variable capacitor 305 may be determined based, at least in part, on the inductance value of main inductor 301, the inductance value of secondary inductor 303, mutual inductance value of the main inductor 301 and the secondary inductor 303, and the frequency ω. Substituting equation 5 into equation 4 and simplifying (see equation 6, below), shows that C is directly proportional to L1 (inductance of main inductor 301), inversely proportional to L2 (inductance of secondary inductor 303), inversely proportional to $M^2$ (mutual inductance of main inductor 301 and secondary inductor 303), and inversely proportional to the square of the frequency ω of the input signal.

$$C = \frac{1}{L2 - \frac{M^2}{L1}} * \frac{1}{\omega^2} \quad \text{(eq. 6)}$$

Figure 4:
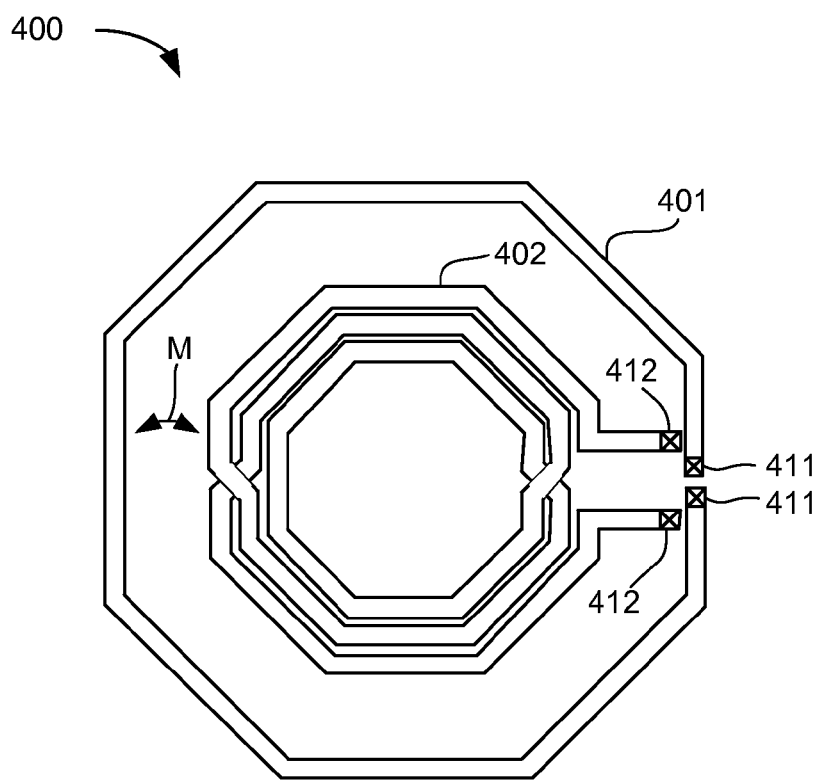
FIG. 4 shows a diagram of example inductors that may be used with the configurable notch filter of FIG. 3, in accordance with example embodiments.

FIG. 4 shows a diagram 400 of example inductors that may be used with configurable notch filter 300, in accordance with example embodiments. Diagram 400 includes a first inductor 401 and a second inductor 402. In some embodiments, first inductor 401 and second inductor 402 may be mutual inductors having a mutual inductance value of M henrys. First inductor 401 may include first inductor terminals 411 and second inductor 402 may include second inductor terminals 412.

In some embodiments, first inductor 401 may be main inductor 301 and second inductor 402 may be secondary inductor 303 within the configurable notch filter 300 of FIG. 3. As shown, main inductor 301 may encircle secondary inductor 303. First inductor terminals 411 may receive transmit communication signal 231. Second inductor terminals 412 may be coupled to additional components of configurable notch filter 300 (not shown for simplicity). In other embodiments, second inductor 402 may be main inductor 301 and first inductor 401 may be secondary inductor 303. Thus, secondary inductor 303 may encircle main inductor 301. Second inductor terminals 412 may receive transmit communication signal 231 and first inductor terminals 411 may be coupled to additional components of configurable notch filter 300.

As shown, first inductor 401 is a single turn inductor and second inductor 402 is a multi-turn inductor. In other embodiments, first inductor 401 may be a multi-turn inductor and second inductor 402 may be a single turn inductor. In still other embodiments, both first inductor 401 and second inductor 402 may be single turn inductors or multi-turn inductors.

In some embodiments, first inductor 401 may be shared with other sections of analog processor 130. For example, first inductor 401 may be included within modulation block 230 as part of a mixer (not shown for simplicity). Although diagram 400 shows only two inductors, in other embodiments, more than two inductors may be included within configurable notch filter 300. For example, two or more configurable notch filters may be cascaded and may share main inductor 301. The two or more configurable notch filters may also have concentrically nested secondary inductors (e.g., to reduce die area). The two or more configurable notch filters may allow a plurality of sets of frequencies to be attenuated from an input signal, such as transmit communication signal 231. Cascaded configurable notch filters and concentrically nested inductors are described in more detail below in conjunction with FIGS. 5 and 6.

Figure 5:
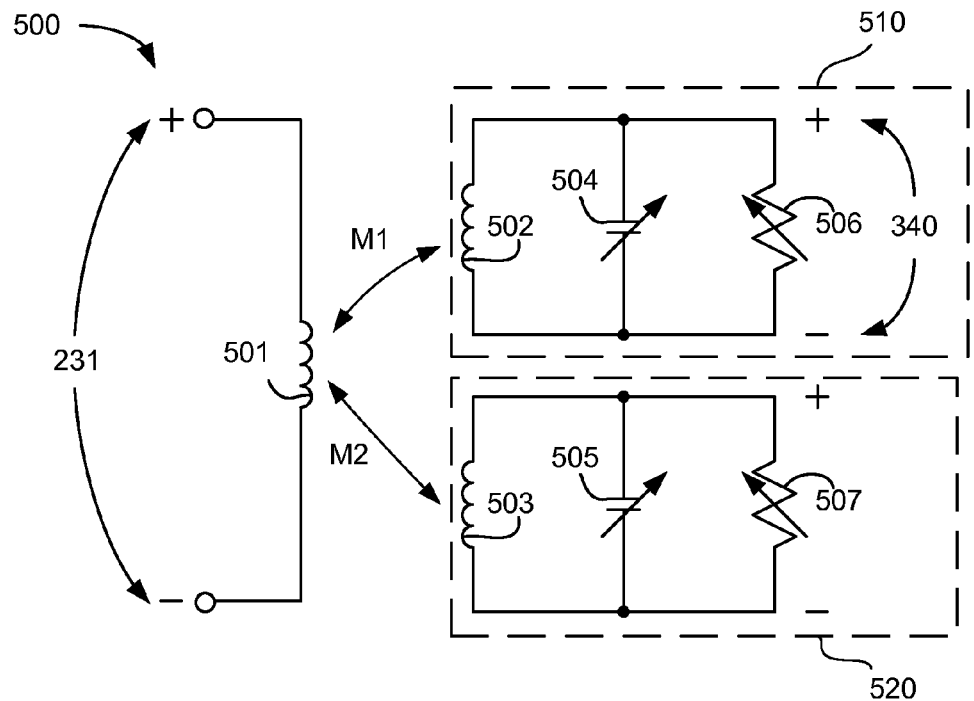
FIG. 5 shows a simplified schematic diagram of another example embodiment of a configurable notch filter.

FIG. 5 shows a simplified schematic diagram of another example embodiment of a configurable notch filter 500. Configurable notch filter 500 may be a cascaded configurable notch filter and may include two or more distinct configurable notch filters. In at least one embodiment, configurable notch filter 500 may include a main inductor 501, a first secondary inductor 502, a second secondary inductor 503, a first variable capacitor 504, a second variable capacitor 505, a first variable resistor 506, and a second variable resistor 507. In some embodiments, main inductor 501 and first secondary inductor 502 may be mutual inductors with a first mutual inductance value of M1 henrys. In a similar manner, main inductor 501 and second secondary inductor 503 may be a second mutual inductor with a second mutual inductance value of M2 henrys.

An input signal, such as transmit communication signal 231, may be provided to terminals of main inductor 501. First secondary inductor 502, first variable capacitor 504, and first variable resistor 506 may form, at least in part, a first configurable notch filter 510 to attenuate a first set of frequencies. Second secondary inductor 503, second variable capacitor 505, and second variable resistor 507 may form, at least in part, a second configurable notch filter 520 to attenuate a second set of frequencies.

In some embodiments, output signal 340 may be generated across first variable resistor 506, first secondary inductor 502, and/or first variable capacitor 504 as shown in FIG. 5. In other embodiments, output signal 340 may be generated across second variable resistor 507, second secondary inductor 503, and/or second variable capacitor 505. In some embodiments, output signal 340 may be determined by equations 1-3 as described above. For example, equations 2 and 3 may be expanded to include terms for both first configurable notch filter 510 and second configurable notch filter 520. Thus, capacitance values for first variable capacitor 504 and second variable capacitor 505 may be selected to attenuate two different sets of frequencies.

In some embodiments, first secondary inductor 502 and second secondary inductor 503 may be concentrically nested (e.g. concentrically located with respect to each other). Some possible arrangements of concentrically nested inductors are shown below in conjunction with FIG. 6.

Figure 6:
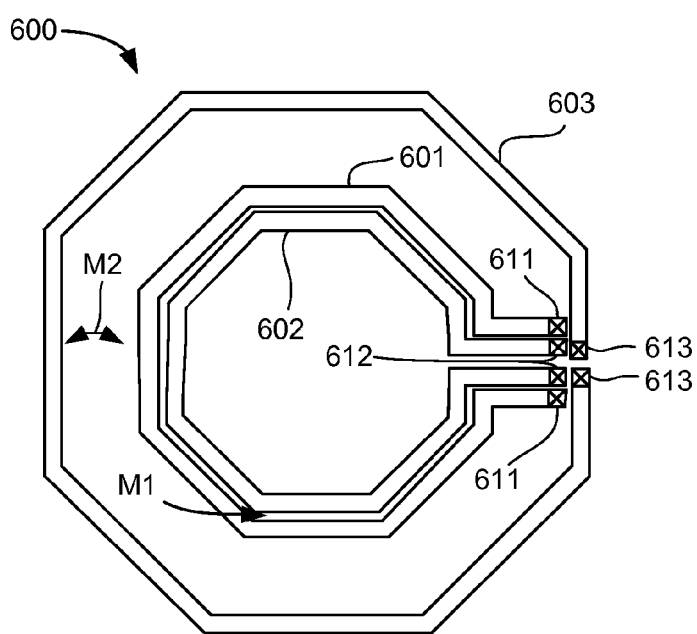
FIG. 6 is a diagram of concentrically nested inductors that may be used with the configurable notch filter of FIG. 5, in accordance with example embodiments.

FIG. 6 is a diagram 600 of concentrically nested inductors that may be used with configurable notch filter 500, in accordance with example embodiments. Diagram 600 includes a first inductor 601, a second inductor 602, and a third inductor 603. First inductor 601 and second inductor 602 may be other embodiments of first inductor 401 and second inductor 402 described in FIG. 4. In some embodiments, first inductor 601 and second inductor 602 may be mutual inductors having a mutual inductance value of M1 henrys. In a similar manner, first inductor 601 and third inductor 603 may be mutual inductors having a mutual inductance value of M2 henrys. First inductor 601 may include first inductor terminals 611, second inductor 602 may include second inductor terminals 612, and third inductor 603 may include third inductor terminals 613.

As shown, first inductor 601, second inductor 602, and third inductor 603 may be concentrically nested with respect to each other. In some embodiments, first inductor 601 may encircle second inductor 602. Additionally, third inductor 603 may encircle first inductor 601 (and by extension, second inductor 602).

In some embodiments, first inductor 601 may be main inductor 501, second inductor 602 may be a first secondary inductor 502, and third inductor 603 may be a second secondary inductor 503 within configurable notch filter 500.

Thus, main inductor 501 may encircle first secondary inductor 502. A signal, such as transmit communication signal 231 may be provided to first inductor terminals 611. Second inductor terminals 612 may be coupled to additional components of configurable notch filter 500 (not shown for simplicity). Second secondary inductor 503 (e.g. third inductor 603) may encircle main inductor 501. Third inductor terminals 613 may also be coupled to other additional components of configurable notch filter 500.

Although shown as single turn inductors in FIG. 6, in other embodiments, one or more of the inductors 601-603 may be multi-turn inductors. Additionally, although first inductor 601 is described as main inductor 501, in other embodiments, main inductor 501 may be any technically feasible inductor included within configurable notch filter 500. For example, second inductor 602 or third inductor 603 may be main inductor 501.

Figure 7:
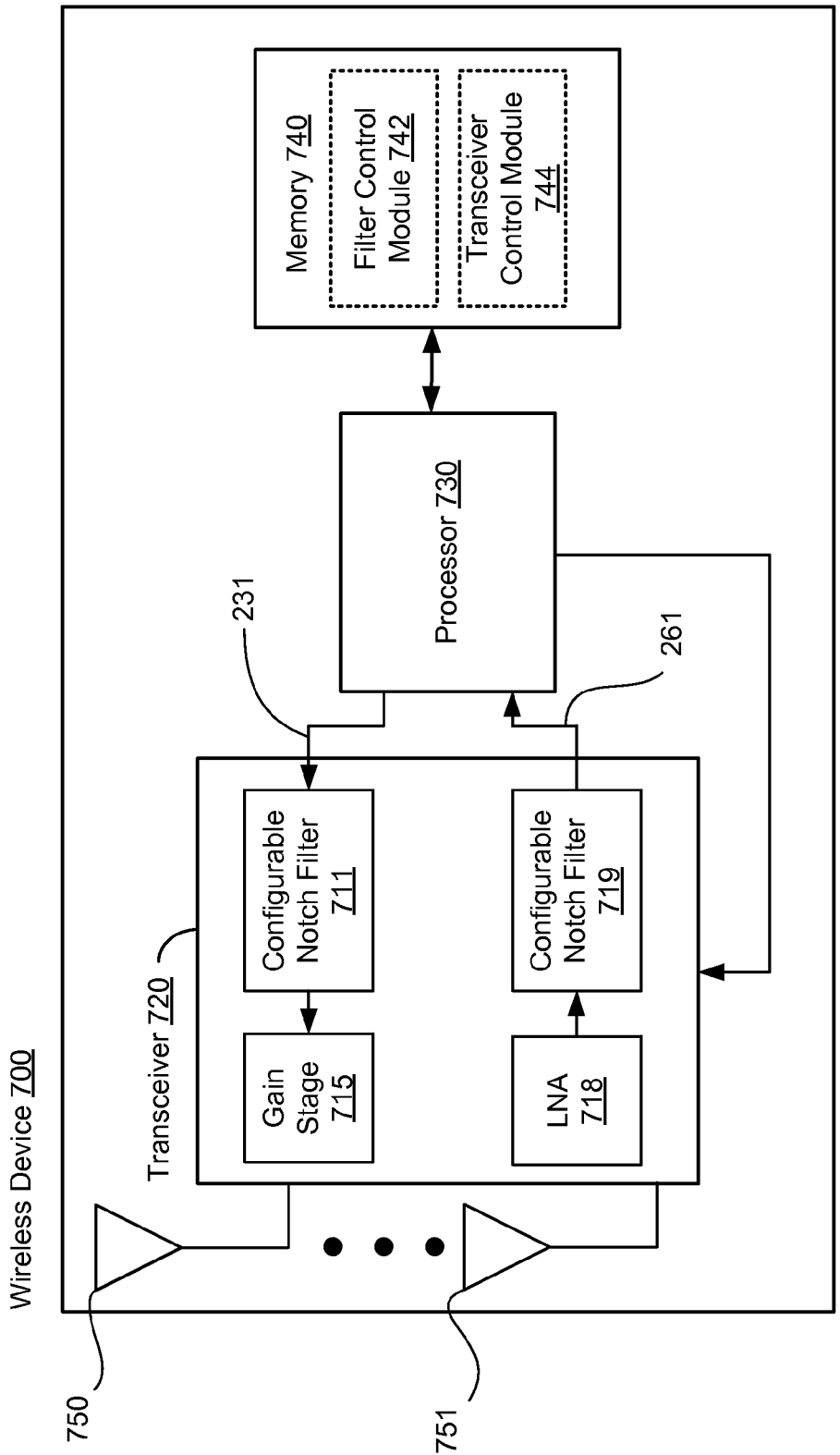
FIG. 7 shows a wireless device that is one embodiment of the wireless devices of FIG. 1.

FIG. 7 shows a wireless device 700 that is one embodiment of the wireless devices 102 and 103 of FIG. 1. Wireless device 700 includes a transceiver 720, a processor 730, a memory 740, and antennas 750 and 751. Although only two antennas 750 and 751 are shown here, wireless device 700 may include any number of antennas.

The transceiver 720 may be used to transmit signals to and receive signals from other wireless devices. Transceiver 720 may include a first configurable notch filter 711 and a gain stage 715 to filter and amplify transmit communication signal 231 for transmission through at least one of antennas 750 and 751. Transceiver 720 may also include an LNA 718 and a second configurable notch filter 719 to receive, amplify, and filter receive communication signal 261 from at least one of antennas 750 and 751. In some embodiments, a single configurable notch filter may be used to implement both first configurable notch filter 711 and second configurable notch filter 719. For example, if transceiver 720 is limited to operating in a half-duplex mode, then transceiver 720 may not receive and transmit communication signals concurrently. Thus, a single configurable notch filter may be shared and used to filter both receive and transmit communication signals by selectively coupling to the single configurable notch filter to gain stage 715 and LNA 718 (not shown for simplicity).

Memory 740 may include a non-transitory computer-readable storage medium (e.g., one or more nonvolatile memory elements, such as EPROM, EEPROM, Flash memory, a hard drive, etc.) that may store the following software modules:

- a filter control module 742 to control and configure first configurable notch filter 711 and/or second configurable notch filter 719; and
- a transceiver control module 744 to control and configure transceiver 720 to transmit and/or receive communication signals.

Each software module includes program instructions that, when executed by processor 730, may cause wireless device 700 to perform the corresponding function(s). Thus, the non-transitory computer-readable storage medium of memory 740 may include instructions for performing all or a portion of the operations of FIG. 8.

Processor 730, which is coupled to transceiver 720 and memory 740, may be any one or more suitable processors capable of executing scripts or instructions of one or more software programs stored in wireless device 700 (e.g., within memory 740).

Processor 730 may execute filter control module 742 to configure first configurable notch filter 711 and/or second configurable notch filter 719 to attenuate one or more sets of frequencies within one or more signals. In some embodiments, first configurable notch filter 711 and/or second configurable notch filter 719 may be configured to attenuate frequency spurs or signal harmonics of a signal based on known signal characteristics. For example, if transmit communication signal 231 has a known frequency spur located at three times (3×) an LO frequency, then processor 730 may configure first configurable notch filter 711 to attenuate frequencies near three times the LO frequency. In some embodiments, processor 730 may determine capacitance values and/or resistance values for first configurable notch filter 711 and/or second configurable notch filter 719 to filter a communication signal.

Processor 730 may execute transceiver control module 744 to control transceiver 720. For example, processor 730 may determine an LO frequency used to receive and/or transmit a communication signal through transceiver 720. In some embodiments, processor 730 may determine an amount of gain to apply through gain stage 715 to transmit the transmit communication signal 231. In other embodiments, processor 730 may determine an amount of gain to apply through LNA 718 to receive the receive communication signal 261.

Figure 8:
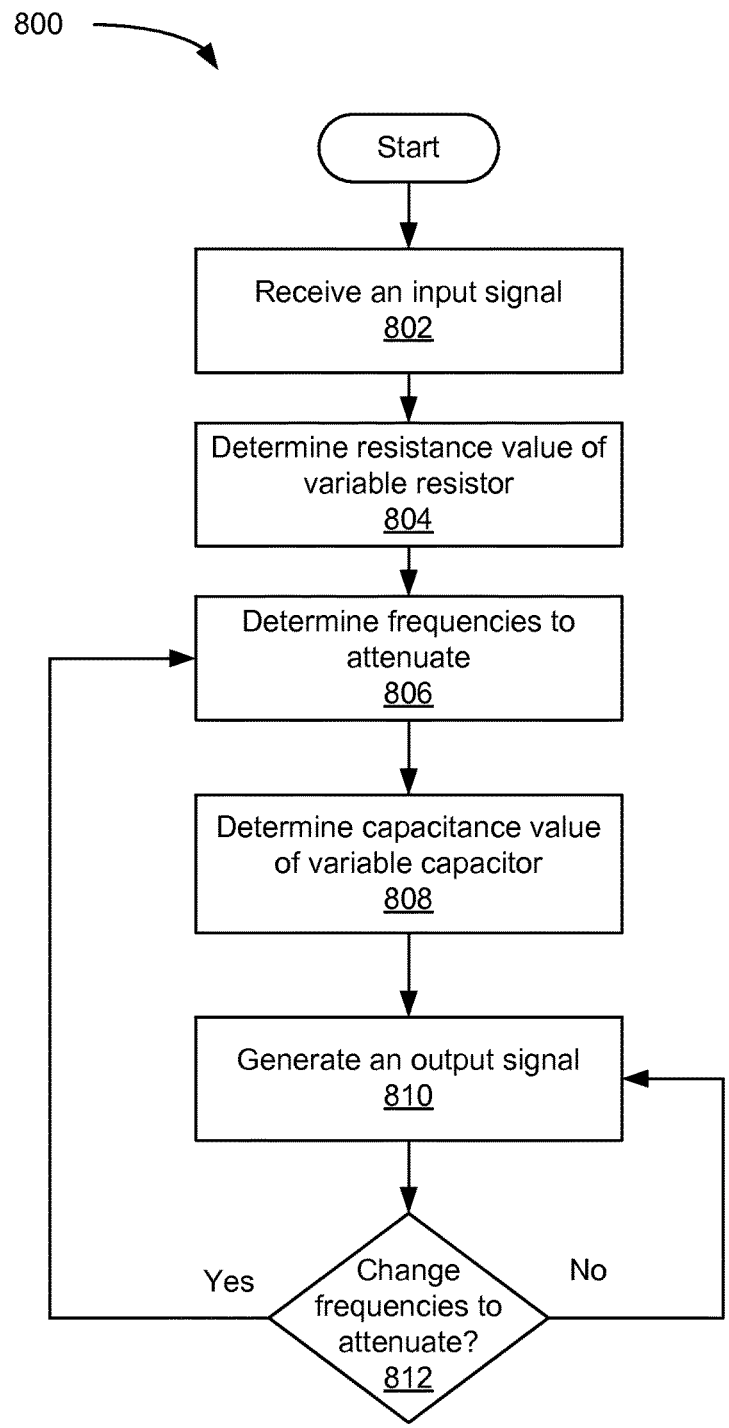
FIG. 8 shows an illustrative flow chart depicting an example operation for operating a configurable notch filter, in accordance with example embodiments.

FIG. 8 shows an illustrative flow chart depicting an example operation 800 for operating configurable notch filter 300, in accordance with example embodiments. Some embodiments may perform the operations described herein with additional operations, fewer operations, operations in a different order, operations in parallel, and/or some operations differently. Example operation 800 may be performed by wireless device 700 depicted in FIG. 7. In other embodiments, operation 800 may be performed by other wireless devices or processors (not shown, for simplicity). Referring also to FIG. 3, an input signal is received by configurable notch filter 300 (802). In some embodiments, the input signal may be transmit communication signal 231. In other embodiments, the input signal may be any technically feasible analog signal.

Next, a resistance value for variable resistor 307 of configurable notch filter 300 is determined (804). In some embodiments, the resistance value may be a negative resistance value to compensate for resistive losses within configurable notch filter 300.

Next, attenuation frequencies associated with configurable notch filter 300 are determined (806). In some embodiments, attenuation frequencies may be based, at least in part, on a known signal characteristic of the input signal. For example, if the input signal is a transmit communication signal 231 based on a known LO frequency, then the attenuation frequencies may be associated with (e.g., be multiples of) the LO frequency. Thus, a set of attenuation frequencies may be associated with a multiple of the LO frequency.

Next, a capacitance value for variable capacitor 305 of configurable notch filter 300 is determined (808). In some embodiments, the capacitance value of variable capacitor 305 may be determined in accordance with equations 4 and 5. For example, the capacitance value may be based, at least in part, on an inductance value of main inductor 301, an inductance value of secondary inductor 303, a mutual inductance value associated with main inductor 301 and secondary inductor 303, and attenuation frequencies.

Next, an output signal is generated by configurable notch filter 300 (810). For example, configurable notch filter 300 may generate an output signal 340 based, at least in part, on the input signal (received at 802), a determined resistance value (determined at 804), and/or a determined capacitance value (determined at 806).

Next, a change of attenuation frequencies is determined (812). If the attenuation frequencies associated with configurable notch filter 300 are to change, then operations proceed to 806. If the attenuation frequencies associated with configurable notch filter 300 are not to change, then operations proceed to 810.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences, or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A configurable notch filter to attenuate a set of frequencies within a transmit communication signal near a notch frequency, the configurable notch filter comprising:
   a first inductive element to receive the transmit communication signal;
   a second inductive element magnetically coupled to the first inductive element; and
   a first variable capacitor electrically coupled in parallel to the second inductive element, the first variable capacitor having a first capacitance value that is directly proportional to an inductance value of the first inductive element and is inversely proportional to an inductance value of the second inductive element.

2. The configurable notch filter of claim 1, wherein the first inductive element and the second inductive element form a mutual inductor with a mutual inductance value.

3. The configurable notch filter of claim 2, wherein the first capacitance value of the first variable capacitor is inversely proportional to the mutual inductance value.

4. The configurable notch filter of claim 1, wherein the first capacitance value is inversely proportional to a square of the notch frequency.

5. The configurable notch filter of claim 1, wherein the first inductive element encircles the second inductive element.

6. The configurable notch filter of claim 1, further comprising:
   a first variable resistor electrically coupled in parallel to the second inductive element to compensate for resistive losses associated with the configurable notch filter.

7. The configurable notch filter of claim 6, wherein a resistance value of the first variable resistor is a negative resistance value.

8. The configurable notch filter of claim 6, further comprising:
   a third inductive element magnetically coupled to the first inductive element;
   a second variable resistor electrically coupled in parallel to the third inductive element, to compensate for resistive losses associated with the third inductive element; and
   a second variable capacitor electrically coupled in parallel to the third inductive element, the second variable capacitor having a second capacitance value that is directly proportional to an inductance value of the first inductive element, and is inversely proportional to an inductance value of the third inductive element.

9. The configurable notch filter of claim 8, wherein the third inductive element encircles the first inductive element and the second inductive element.

10. A method of attenuating a set of frequencies within a transmit communication signal near a notch frequency, the method comprising:
    receiving, at a first inductive element, the transmit communication signal;
    magnetically coupling a second inductive element to the first inductive element; and
    determining a capacitance value of a first variable capacitor that is directly proportional to an inductance value of the first inductive element and is inversely proportional to an inductance value of the second inductive element.

11. The method of claim 10, wherein the first inductive element and the second inductive element form a mutual inductor with a mutual inductance value.

12. The method of claim 11, wherein the capacitance value of the first variable capacitor is inversely proportional to the mutual inductance value.

13. The method of claim 10, wherein the capacitance value is substantially inversely proportional to a square of the notch frequency.

14. The method of claim 10, wherein the first inductive element encircles the second inductive element.

15. The method of claim 10, further comprising:
    electrically coupling a first variable resistor in parallel to the second inductive element, and
    compensating, by the first variable resistor, for resistive losses associated with the second inductive element.

16. The method of claim 15, wherein a resistance value of the first variable resistor is a negative resistance value.

17. The method of claim 15, further comprising:
magnetically coupling a third inductive element to the first inductive element;
electrically coupling a second variable resistor in parallel to the third inductive element; and
determining a capacitance value of a second variable capacitor that is directly proportional to an inductance value of the first inductive element, and is inversely proportional to an inductance value of the third inductive element.

18. The method of claim 17, wherein the third inductive element encircles the first inductive element and the second inductive element.

19. A communications device, comprising a configurable notch filter to attenuate a set of frequencies within a transmit communication signal near a notch frequency, the configurable notch filter comprising:
a first inductive element to receive the transmit communication signal;
a second inductive element magnetically coupled to the first inductive element; and
a first variable capacitor electrically coupled in parallel to the second inductive element, the first variable capacitor having a first capacitance value that is directly proportional to an inductance value of the first inductive element and is inversely proportional to an inductance value of the second inductive element.

20. The communications device of claim 19, wherein the configurable notch filter further comprises:
a first variable resistor electrically coupled in parallel to the second inductive element to compensate for resistive losses associated with the configurable notch filter;
a third inductive element magnetically coupled to the first inductive element, wherein the third inductive element encircles the first inductive element and the second inductive element;
a second variable resistor electrically coupled in parallel to the third inductive element, to compensate for resistive losses associated with the third inductive element; and
a second variable capacitor electrically coupled in parallel to the third inductive element, the second variable capacitor having a second capacitance value that is directly proportional to an inductance value of the first inductive element, and is inversely proportional to an inductance value of the third inductive element.

* * * * *